United States Patent
Lin

(10) Patent No.: US 6,232,560 B1
(45) Date of Patent: May 15, 2001

(54) ARRANGEMENT OF PRINTED CIRCUIT TRACES

(75) Inventor: Yu-Hsu Lin, Fremont, CA (US)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 09/207,863

(22) Filed: Dec. 8, 1998

(51) Int. Cl.$^7$ .................................................. H01L 23/57
(52) U.S. Cl. .......................... 174/257; 174/256; 361/777
(58) Field of Search ................................... 174/250, 253, 174/254, 117 FF, 257, 256; 361/777; 331/1, 12, 32

(56) References Cited

U.S. PATENT DOCUMENTS 4,707,671 * 11/1987 Suzuki et al. .............................. 333/1
5,764,489 * 6/1998 Leigh et al. ........................... 361/777

* cited by examiner

*Primary Examiner*—Albert W. Paladini
(74) *Attorney, Agent, or Firm*—Wei Te Chung

(57) ABSTRACT

An arrangement of printed circuit traces includes a plurality of signal and ground traces on both surfaces of a substrate alternately arranged whereby no two signal traces are adjacent to each other on the same surface and a signal trace on one surface is aligned with a ground trace on the opposite surface. The ground traces on one surface of the substrate can be replaced with power pins for a high speed signal transmission application. Alternatively, a pair of signal traces can be provided between adjacent power pins on one surface of a substrate and between adjacent ground traces on an opposite surface of the substrate. Each signal trace is formed closer to the adjacent power pin or ground trace than the adjacent signal trace. The width of each power pin and ground trace is larger than the distance between outer extremes of each pair of signal traces.

9 Claims, 3 Drawing Sheets

ARRANGEMENT OF PRINTED CIRCUIT TRACES

BACKGROUND OF THE INVENTION

1. Field of The Invention

The present invention is related to an arrangement of printed circuit traces, and more particularly to an arrangement of printed circuit traces which ensures proper signal transmission by eliminating cross talk between adjacent signal traces.

2. The Prior Art

Printed circuit boards are essential elements of any computer system for mounting electrical components thereon and providing an efficient method of signal transmission between the components through signal traces formed therein. Flexible printed circuits are also becoming increasingly popular due to the efficient use of space provided thereby. As the trend of the computer industry continues toward miniaturization, the signal traces of printed circuits are being formed at increasingly higher densities. Such close proximity results in cross talk between adjacent signal traces which adversely affects signal transmission.

A conventional arrangement of printed circuit traces is shown in FIG. 5. A ground plane 25 is formed on a bottom surface of a substrate 30 and a plurality of signal traces 10 are formed on a top surface thereof. Since the signal traces 10 are formed adjacent to each other near one surface of the substrate, cross talk therebetween and, subsequently, poor signal transmission are inevitable. In addition, control of the effective impedance of the signal traces 10 and ground plane 25 becomes complicated since the only variable design parameters are the depth and width of the signal traces 10. An increase in the width of the signal traces 10 would result in more cross talk therebetween, and an increase in the height of the signal traces 10 would increase the occupied space of a circuit board in which the signal traces 10 are formed.

FIG. 6 shows a conventional four layer printed circuit arrangement used in high speed signal transmission applications. A pair of internal planes 25, 45 serve as a means for conducting ground and power signals, respectively, and a substrate 30 is provided therebetween and on outer surfaces thereof. Signal traces 10 are formed on near outer surfaces of the substrate 30. Cross talk between adjacent signal traces 10 is reduced by such an arrangement but the cost of manufacture is greatly increased. Furthermore, control of the effective inductance between power and ground becomes complicated due to the power and ground planes 25, 45 not having variable parameters.

Therefore, an improved arrangement of printed circuit traces is required which can overcome the disadvantages of the prior art.

SUMMARY OF THE INVENTION

Accordingly, an objective of the present invention is to provide an arrangement of printed circuit traces having a high density of signal traces.

Another objective of the present invention is to provide an arrangement of printed circuit traces whereby cross talk is effectively eliminated between adjacent signal traces.

A further objective is to provide an arrangement of printed circuit traces having variables for controlling effective impedance and inductance between different types of circuit traces.

Yet another objective of the present invention is to provide an arrangement of printed circuit traces having an increased number of signal traces.

Yet a further objective of the present invention is to provide an arrangement of printed circuit traces which facilitates the cost efficient manufacture of a printed circuit board or a flexible printed circuit.

To fulfill the above objectives, an arrangement of printed circuit traces in accordance with an aspect of the present invention comprises a plurality of signal and ground traces alternately arranged on both surfaces of a substrate whereby no two signal traces are adjacent to each other and a signal trace on one surface is aligned with a ground trace on the opposite surface.

According to another aspect of the present invention the ground traces on one surface of the substrate are replaced with power traces for high speed signal transmission applications.

In accordance with a third aspect of the present invention, a pair of signal traces are provided between adjacent power traces on one surface of a substrate and between adjacent ground traces on an opposite surface of the substrate. Each signal trace is 15 formed closer to the adjacent power trace or ground trace than the adjacent signal trace. The width of each power trace and ground trace is larger than the distance between outer extremes of each pair of signal traces.

These and additional objectives, features, and advantages of the present invention will become apparent after reading the following detailed description of the preferred embodiments of the invention taken in conjunction with the appended drawing figures.

DETAILED DESCRIPTION OF THE PREFERRED EMBODIMENTS

Figure 1:
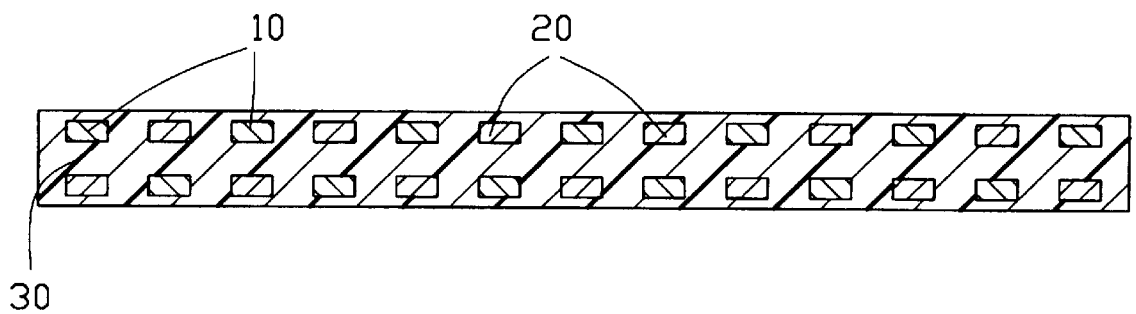
FIG. 1 is a cross sectional view of a PC board in accordance with a first embodiment of the present invention.

References will now be made in detail to the preferred embodiments of the invention. It will be noted here that for facilitating understanding, most of like components are designated by like reference numerals throughout the various figures of the different embodiments.

Figure 2:
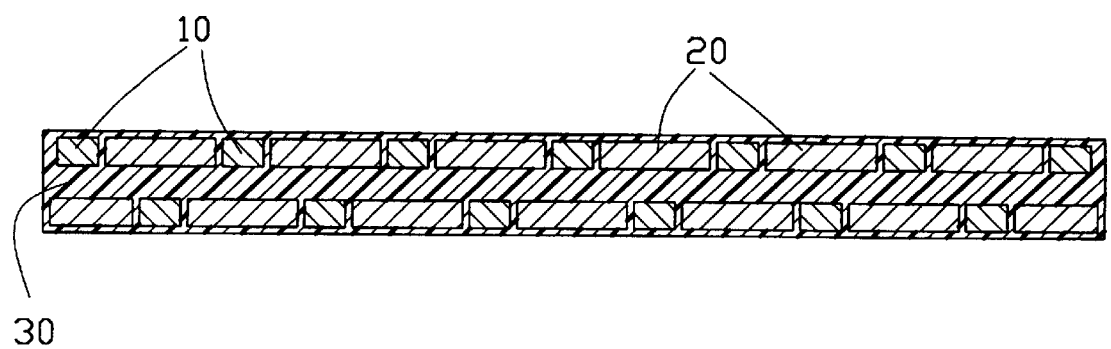
FIG. 2 is a variation of FIG. 1.

Referring to FIG. 1, a PC board comprises a plurality of signal traces 10 and ground traces 20 on both surfaces of a substrate 30. The traces 10, 20 are alternately arranged whereby no two signal traces 10 are adjacent to each other and a signal trace 10 on one surface is aligned with a ground trace 20 on an opposite surface. Such an arrangement allows for a higher density of signal traces 10 while effectively eliminating cross talk therebetween. In addition, the width of the ground traces 20 can be increased as shown in FIG. 2 to control the effective impedance of the signal and ground traces 10, 20.

Figure 3:
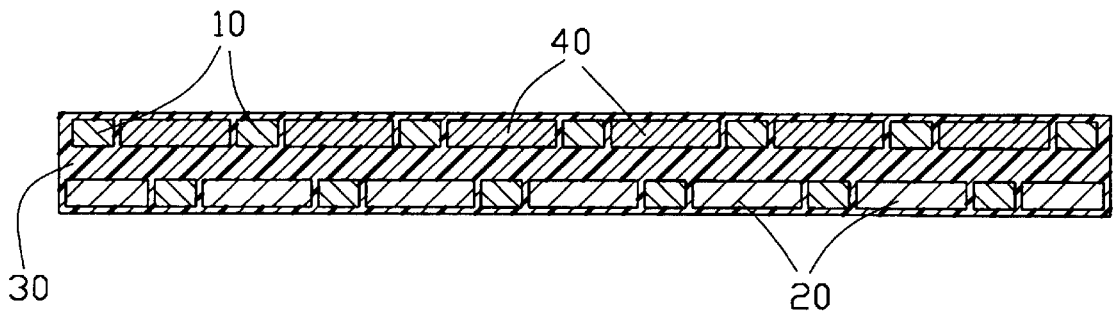
FIG. 3 is a cross sectional view of a PC board in accordance with a second embodiment of the present invention.

A second embodiment of the present invention is shown in FIG. 3. This arrangement is similar to the one shown in FIG. 1 except that the ground traces 20 on one surface of the substrate 30 are replaced with power traces 40 to adapt the board for a high speed signal transmission application. The width of the power traces 40 is increased to allow for the increase in current. The width of the ground traces 20 can also be varied to lower the effective inductance between power and ground. For high frequency applications, power and ground have the same effect thus cross talk between signal traces 10 is still effectively eliminated.

Figure 4:
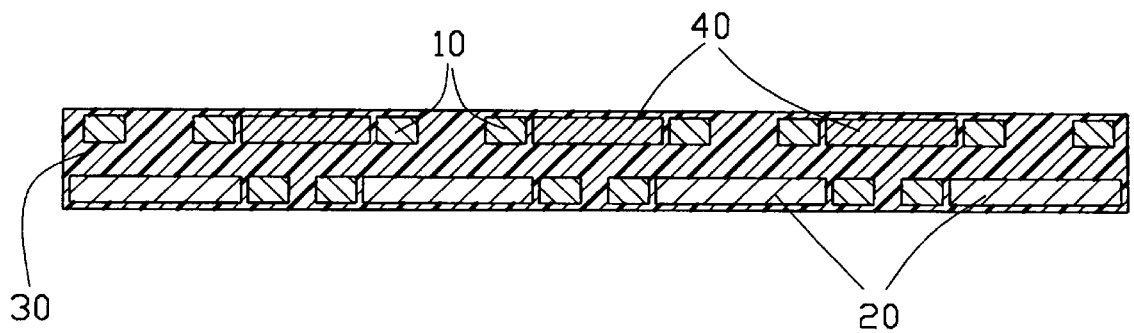
FIG. 4 is a cross sectional view of a PC board in accordance with a third embodiment of the present invention.
Figure 5:
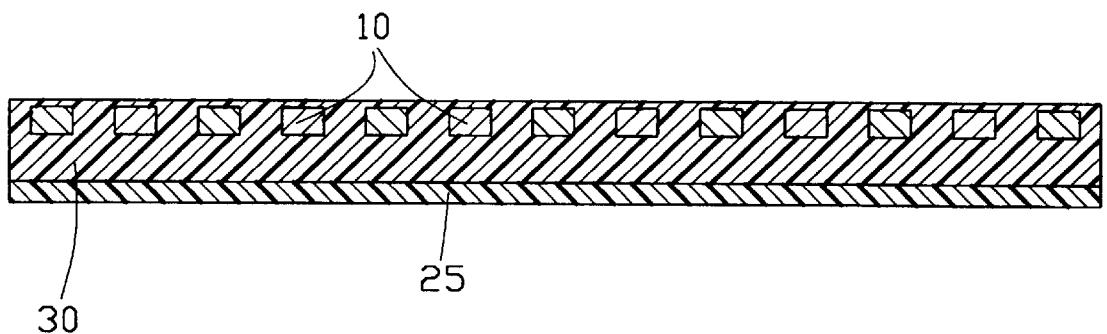
FIG. 5 is a cross sectional view of a conventional PC board.
Figure 6:
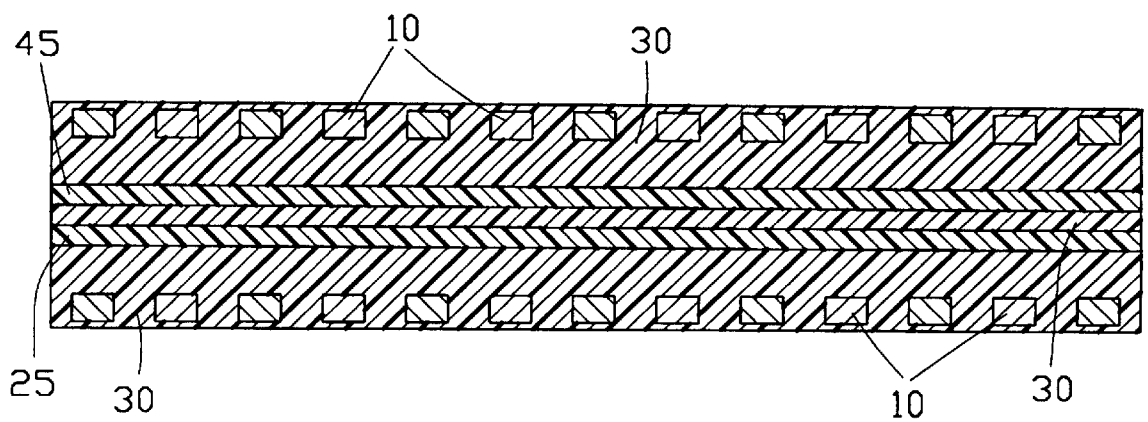
FIG. 6 is a cross sectional view of another conventional PC board.

FIG. 4 shows a third embodiment of the present invention. A pair of signal traces 10 are provided between adjacent power traces 40 on one surface of the substrate 30 and between adjacent ground traces 20 on an opposite surface of the substrate 30. Each signal trace 10 is formed closer to the adjacent power trace 40 or ground trace 20 than the adjacent signal trace 10. The width of either power trace 40 or ground trace 20 is larger than the distance between outer extremes of each corresponding pair of signal traces 10, whereby cross talk therebetween is effectively eliminated. The width of the power traces 40 and ground traces 20 can further be adjusted to reduce the effective impedance between power and ground. With this arrangement an increased amount of signal traces 10 can be provided on the PC board. It is also understood that for the ground traces on the same surface, some of which may be replaced with power traces, which also perform the same grounding effect as aforementioned and are deemed as another type ground traces during high speed transmission, to comply with the designated application situation, thus providing more flexibility of arrangement of the circuits on the substrate.

Although the present invention has been described with reference to a PC board, it can be understood by those skilled in the art that a flexible printed circuit could easily be manufactured with the same characteristics and benefits. Therefore, a detailed description thereof is omitted herein.

While the present invention has been described with reference to specific embodiments, the description is illustrative of the invention and is not to be construed as limiting the invention. Various modifications to the present invention can be made to the preferred embodiment by those skilled in the art without departing from the true spirit and scope of the invention as defined by the appended claims.

Therefore, persons of ordinary skill in this art are to understand that all such equivalent structures are to be included within the scope of the following claims.

I claim:

1. An arrangement of printed circuit traces on a substrate, comprising:
    a plurality of signal traces provided on both surfaces of the substrate;
    a plurality of ground traces provided on one surface of the substrate; and
    a plurality of power traces provided on a surface of the substrate opposite the ground traces;
    wherein the traces are arranged whereby a pair of signal traces are provided either between adjacent ground traces on one surface of the substrate or between adjacent power traces on an opposite surface of the substrate.

2. The arrangement as described in claim 1, wherein each signal trace is formed closer to the adjacent power trace or ground trace than the adjacent signal trace.

3. The arrangement as described in claim 1, wherein the width of the power traces and ground traces can be varied to control the effective inductance between power and ground.

4. The arrangement as described in claim 1, wherein either ground traces or power pins are wider than the signal traces.

5. The arrangement as described in claim 1, wherein the width of either the power pin or the ground trace is larger than the distance between outer extremes of each corresponding pair of signal traces.

6. The arrangement as described in claim 1, wherein the substrate is a printed circuit board or a flexible printed circuit.

7. An arrangement of printed traces on a substrate, comprising a plurality of pairs of signal traces and a plurality of ground traces or power traces alternately arranged on at least one surface of the substrate wherein the ground traces or the power traces are wider than the signal traces, each pair of signal traces being provided between every two adjacent ground or power traces, the pair of signal traces being spaced from each other a distance larger than that between one of the pair of signal traces and its correspondingly neighboring ground or power trace.

8. An arrangement of printed circuit traces on a substrate, comprising:
    a plurality of signal traces provided on first and second surfaces of the substrate;
    a plurality of ground traces provided on the first surface of the substrate;
    a plurality of power traces provided on the second surface of the substrate opposite the ground traces; and
    wherein the traces are so arranged that a pair of signal traces are provided either between adjacent ground traces on the first surface of the substrate or between adjacent power traces on the second surface of the substrate, one of the pair of signal traces being formed closer to an adjacent power trace or ground trace than to the other of the pair of signal traces.

9. The arrangement in accordance with claim 8, wherein a width of either the power trace or the ground trace is larger than a distance between outer extremes of each corresponding pair of signal traces.

* * * * *